United States Patent

Won et al.

Patent Number: 6,133,148
Date of Patent: Oct. 17, 2000

[54] METHOD OF DEPOSITING FILM FOR SEMICONDUCTOR DEVICE IN SINGLE WAFER TYPE APPARATUS USING A LAMP HEATING METHOD

[75] Inventors: Seok-jun Won; Kyoung-hoon Kim, both of Seoul; Young-wook Park, Kyungki-do; Kab-jin Nam, Kyungki-do; Duk-soo Yoon, Kyungki-do; Sun-woo Kwak, Kyungki-do, all of Rep. of Korea

[73] Assignee: Samsung Electronics Co., Ltd., Suwon, Rep. of Korea

[21] Appl. No.: 09/185,093

[22] Filed: Nov. 3, 1998

[30] Foreign Application Priority Data

Nov. 24, 1997 [KR] Rep. of Korea ................. 97-62439

[51] Int. Cl.[7] .................... H01L 21/44; H01L 21/31

[52] U.S. Cl. .................... 438/680; 438/763; 438/907

[58] Field of Search .................... 438/680, 763, 438/907

[56] References Cited

U.S. PATENT DOCUMENTS 4,587,710  5/1986  Tsao .
4,629,635  12/1986  Brors .

FOREIGN PATENT DOCUMENTS

0648859 A1  4/1995  European Pat. Off. .
WO 95/23428  8/1995  WIPO .

*Primary Examiner*—John F. Niebling
*Assistant Examiner*—Josetta Jones
*Attorney, Agent, or Firm*—Jones Volentine, LLP

[57] ABSTRACT

A method of depositing a thin film for a semiconductor device using a lamp heating type apparatus. In the method, a wafer is loaded into a processing chamber of the apparatus, and the pressure of the chamber and the temperature of a susceptor installed in the chamber are increased to a level higher than a deposition pressure and a deposition temperature, respectively. Then, the pressure of the chamber and the temperature of the susceptor are decreased to the deposition pressure and the deposition temperature, respectively, and a film is deposited on the wafer. The vacuum of the chamber is then released and the gas remaining in the chamber and a source gas injection tube is purged.

17 Claims, 5 Drawing Sheets

METHOD OF DEPOSITING FILM FOR SEMICONDUCTOR DEVICE IN SINGLE WAFER TYPE APPARATUS USING A LAMP HEATING METHOD

BACKGROUND OF THE INVENTION

1. Field of the Invention

The present invention relates to a method of fabricating a semiconductor device, and more particularly, to a method of depositing a film for a semiconductor device using a single wafer type apparatus employing a lamp heating method.

2. Description of the Related Art

In general, in a chamber in which a semiconductor device fabricating process is performed, a plate known as a susceptor is installed, on which a wafer is placed for processing. The temperature on the surface of the wafer may be controlled by a variety of devices, including a resistance coil, a radio frequency (RF) heating device, an infra red lamp heating device, or a laser.

The infra red lamp heating apparatus has advantages in that the temperature can be increased and decreased rapidly. An example of the single wafer type apparatus employing the lamp heating method is shown in FIG. 1.

FIG. 1 shows a chemical vapor deposition apparatus including a chamber 21 in which an insulation film or a metal film is deposited through the reaction of a source gas and a reaction gas. A shower head 23 is disposed in the upper part of the chamber 21 for introducing the source gas, the reaction gas and an inert gas to the chamber 21. Connected to the chamber 21, through the shower head 23, are a source gas injection tube 1 for supplying the source gas used to deposit the intended film, a reaction gas injection tube 3 for supplying the reaction gas to react with the source gas, and an inert gas injection tube 5 for supplying an inert gas such as helium (He), argon (Ar) or nitrogen ($N_2$), which does not react with the source gas and the reaction gas. A bypass line 7 allows the source gas to bypass the chamber 21. Valves 11 and 17 control the flow of the source gas through the injection tube 1 and bypass line 7, respectively. Valve 13 controls the flow of the reaction gas through the injection tube 3, and valve 15 controls the flow of the inert gas through the injection tube 5.

A susceptor 25 is disposed in the chamber 21, onto which is mounted a wafer on which a film will be deposited. A lamp unit 27 having a plurality of infrared lamps is disposed below the susceptor 25 and acts as a heating source for heating the susceptor and the wafer. A pressure controller 31 controls the pressure of the chamber 21. The gas is removed from the chamber 21 via a main valve 33 by operation of a pump 35, and is thereafter exhausted through an exhaust tube 37.

Generally, a thin film deposition process using the single wafer type apparatus employing the lamp heating method proceeds as follows. First, the processing conditions of the chamber 21 are stabilized. That is, after mounting a wafer onto the susceptor 25, an inert gas is injected into the chamber 21 via the inert gas injection tube 5, thereby stabilizing the pressure of the chamber 21 at a particular deposition pressure. At this time, the source gas flows through the bypass line 7 while the temperature of the wafer is stabilized at a particular deposition temperature. Next, in order to deposit a thin film, the valve 17 connected to the bypass line 7 is closed, while the valve 11 connected to the source gas injection tube 1 and the valve 13 connected to the reaction gas injection tube 3 are opened, so that the source gas and reaction gas are introduced into the chamber 21 to react and deposit a thin film on the surface of the wafer. Thereafter, the vacuum condition of the chamber 21 is released, and the source gas remaining within the chamber 21 and the source gas injection tube 1 is removed using the pump 35 while supplying the inert gas to purge the chamber 21 and source gas injection tube 1.

More specifically, in the above single wafer type apparatus, wafers are loaded one by one onto the susceptor 25 in the chamber 21. The susceptor 25 is heated directly by the lamp 27, and the temperature thereof is rapidly increased to an intended deposition temperature. Since the temperature of the susceptor 25 is usually maintained at a predetermined temperature close to the intended deposition chamber, the amount of time needed to increase the susceptor 25 to the deposition temperature is very short. However, because the wafer loaded onto the susceptor 25 is introduced to the chamber 21 at room temperature, it takes a long time to increase the temperature of the surface of the wafer and stabilize the processing conditions, thereby decreasing the productivity of the single wafer type apparatus.

SUMMARY OF THE INVENTION

It is an object of the present invention to provide a method of depositing a film for a semiconductor device using a single wafer type apparatus employing a lamp heating method, in which the time required for stabilizing the temperature of a wafer is shortened, thereby increasing productivity.

According to a first aspect of the present invention, there is provided a method of depositing a film for a semiconductor device using a single wafer type apparatus employing a lamp heating method, comprising the step of maintaining the processing chamber of the apparatus at a pressure higher than a deposition pressure, before depositing the film. The pressure of the processing chamber is increased using an inert gas. Preferably, the method further comprises the step of decreasing the pressure of the processing chamber to the deposition pressure before depositing the film.

According to a second aspect of the present invention, there is provided a method of depositing a film for a semiconductor device using a single wafer type apparatus employing a lamp heating method, comprising the steps of loading a wafer into a processing chamber of the apparatus, increasing the pressure of the chamber to a pressure higher than a deposition pressure, and then decreasing the pressure of the chamber to the deposition pressure before depositing a film on the wafer.

Preferably, the steps of increasing and decreasing the pressure of the chamber are performed using an inert gas. Also, the method may further comprise the step of purging an injection tube, into which a source gas is injected, via a bypass line after the step of depositing the film on the wafer.

According to a third aspect of the present invention, there is provided a method of depositing a film for a semiconductor device using a single wafer type apparatus employing a lamp heating method, comprising the step of maintaining a susceptor, installed in a processing chamber of the single wafer type apparatus, at a temperature higher than a deposition temperature, before depositing the film. Preferably, the method further comprises the step of decreasing the temperature of the susceptor to the deposition temperature, before depositing the film.

Preferably, the method further comprises the step of releasing a vacuum in the chamber and purging the reacted gas remaining in the chamber and the source gas in the source gas injection tube, after depositing the film.

Preferably, the method further comprises the step of increasing the temperature of the susceptor to a temperature higher than the deposition temperature, after the purging step.

According to a fourth aspect of the present invention, there is provided a method of depositing a film for a semiconductor device using a single wafer type apparatus employing a lamp heating method, comprising the steps of loading a wafer into a processing chamber of the apparatus, increasing the pressure of the chamber to a pressure higher than a deposition pressure and the temperature of a susceptor installed in the chamber to a temperature higher than a deposition temperature. Then, the pressure of the chamber and the temperature of the susceptor are decreased to the deposition pressure and the deposition temperature, respectively, followed by the film being deposited on the wafer.

Preferably, the steps of increasing and decreasing the pressure of the chamber are performed using an inert gas. Also, in the step of decreasing the pressure of the chamber and the temperature of the susceptor to the deposition pressure and the deposition temperature, respectively, the pressure of the chamber is decreased after a predetermined time has lapsed after decreasing the temperature of the susceptor.

According to the present invention, before the film is deposited, the pressure of the chamber and/or the temperature of the susceptor are/is increased to above the deposition pressure and/or deposition temperature, to reduce the stabilization time required for increasing the temperature and the pressure to the levels for deposition, thereby increasing the rate at which wafers are processed.

BRIEF DESCRIPTION OF THE DRAWINGS

The above objects and advantages will be described with reference to the accompanying drawings, in which.

DESCRIPTION OF THE PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

As described above, a processing time (hereinafter referred as to "stabilization time") which is required for stabilizing a wafer after the wafer is mounted onto a susceptor, e.g., by increasing the temperature at the surface of the wafer to the deposition temperature, greatly affects the yield. If the stabilization time is too short, the deposition is performed while the temperature at the surface of the wafer is lower than the intended deposition temperature, which seriously affects the quality of film and the yield of the facility.

EXPERIMENTAL EXAMPLE 1

Figure 2:
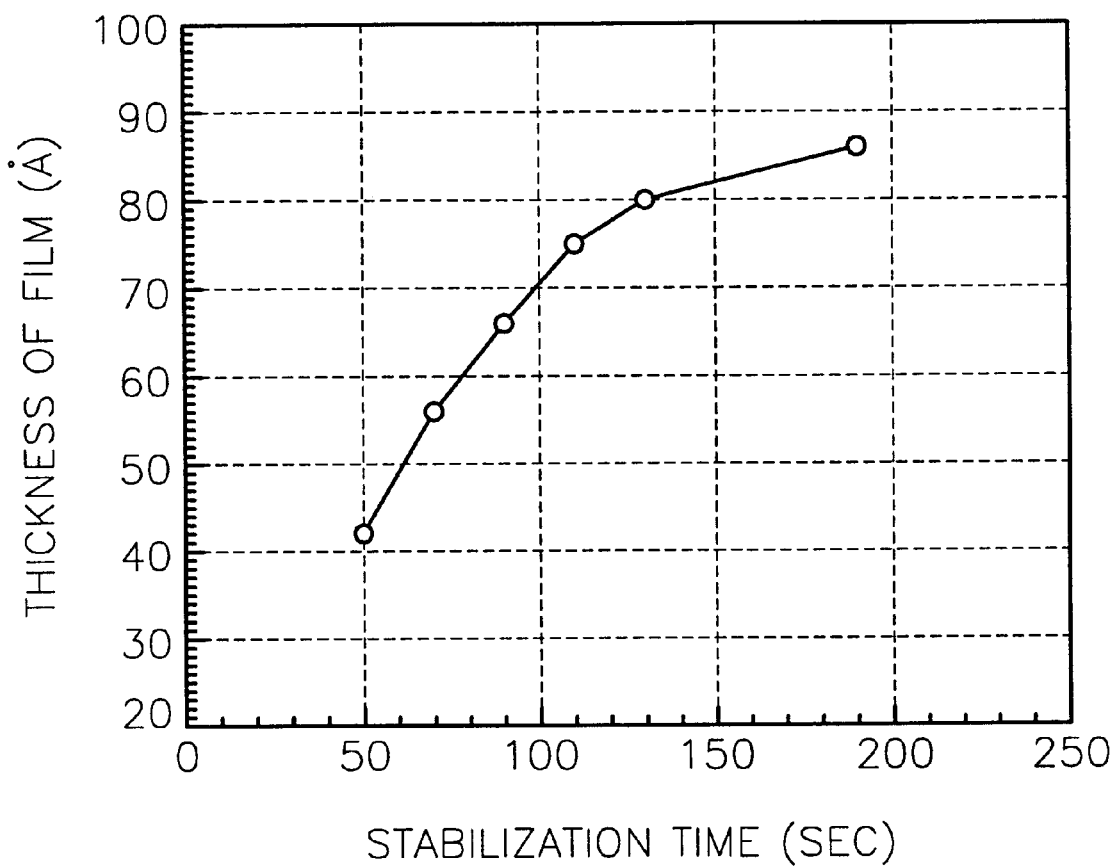
FIG. 2 is a graph showing the relationship between stabilization time and thin film thickness using the apparatus of FIG. 1.

FIG. 2 is a graph showing the relationship between the stabilization time and the thickness of a deposited film, when a predetermined film, e.g., an insulation film or a metal film, is deposited by a CVD method using a single wafer type apparatus employing a lamp heating method.

In FIG. 2 the intended thickness (about 86–88 Å) is obtained when the deposition process is performed after the temperature of the wafer reaches the intended deposition temperature, which is attained approximately 190 seconds after the installation of a wafer on a susceptor within the chamber. In other words, the optimum stabilization time is equal to 190 seconds. For example, if the stabilization time were reduced to 100 seconds, the deposition process would be performed during the first 90 seconds while the temperature of the wafer is as much as several tens of degrees lower than the intended deposition temperature. Thus, the deposited film thickness is thinner (about 70 Å) compared with the case of the 190-second stabilization time.

Assuming that the deposition process itself takes approximately 2–3 minutes, it is apparent that the intended initial stabilization time (190 seconds) is nearly the same as the deposition time. Thus, it can be seen that reducing the stabilization time would increase productivity.

EXPERIMENTAL EXAMPLE 2

Figure 3:
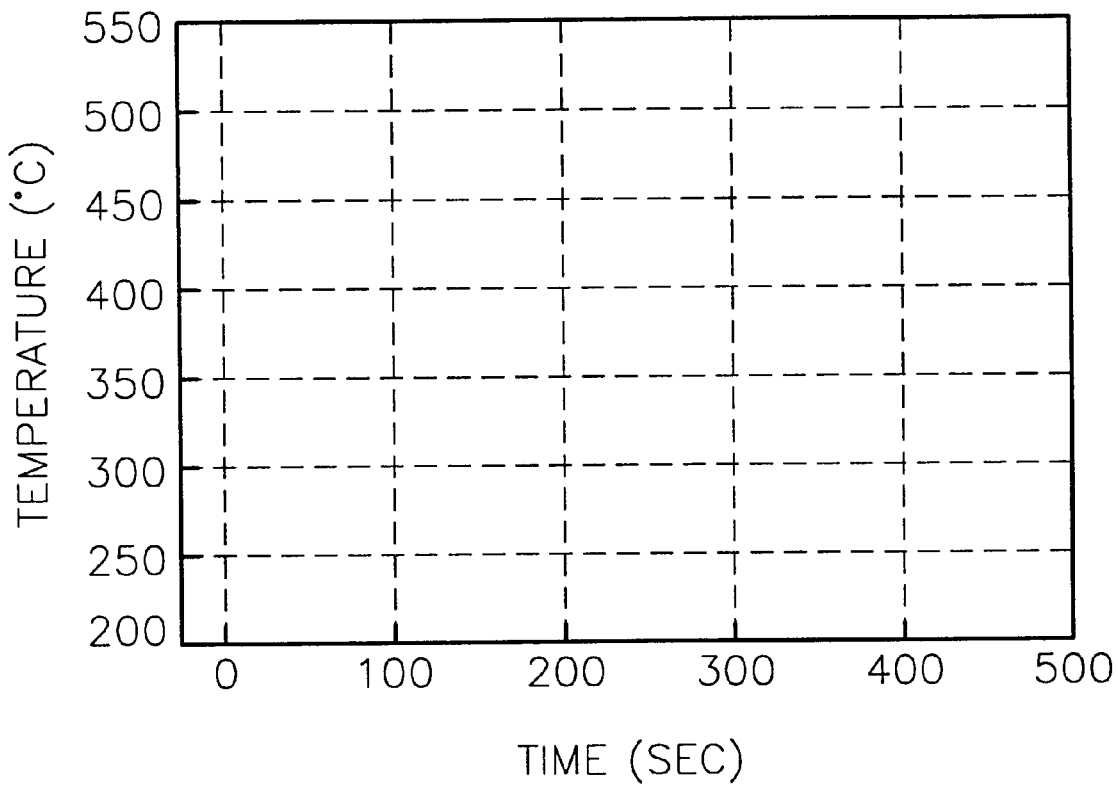
FIG. 3 is a graph showing the relationship between the pressure of the chamber and the temperature of the wafer over an extended time period.
Figure 3:
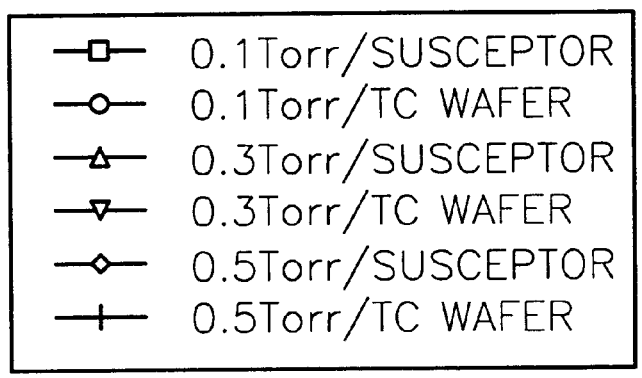

In order to investigate the relationship between the pressure of the chamber and the temperature increase of the wafer, the temperatures of the susceptor and wafer were measured while the pressure of the chamber was varied between 0.1 Torr, 0.3 Torr and 0.5 Torr. The results are shown in FIG. 3. The temperature at the surface of the wafer was measured by using a thermocouple wafer, and the temperature of the susceptor was measured by a thermocouple which was attached to the inside of the susceptor.

As shown in FIG. 3, the temperature curves for the susceptor at 0.1 Torr, 0.3 Torr and 0.5 Torr do not change according to the pressure within the chamber. However, as the pressure of the chamber increases, the temperature curves for the wafer are distinctly different. In other words, as the pressure increases, the stabilization time to reach the intended deposition temperature is reduced, and accordingly, the ratio of the stabilization time to the deposition time is reduced as the pressure increases. Also, note that the temperature curves of the wafer have no overshoot while the temperature curves of the susceptor have a 20–25° C. overshoot before stabilizing.

EMBODIMENT

Figure 1:
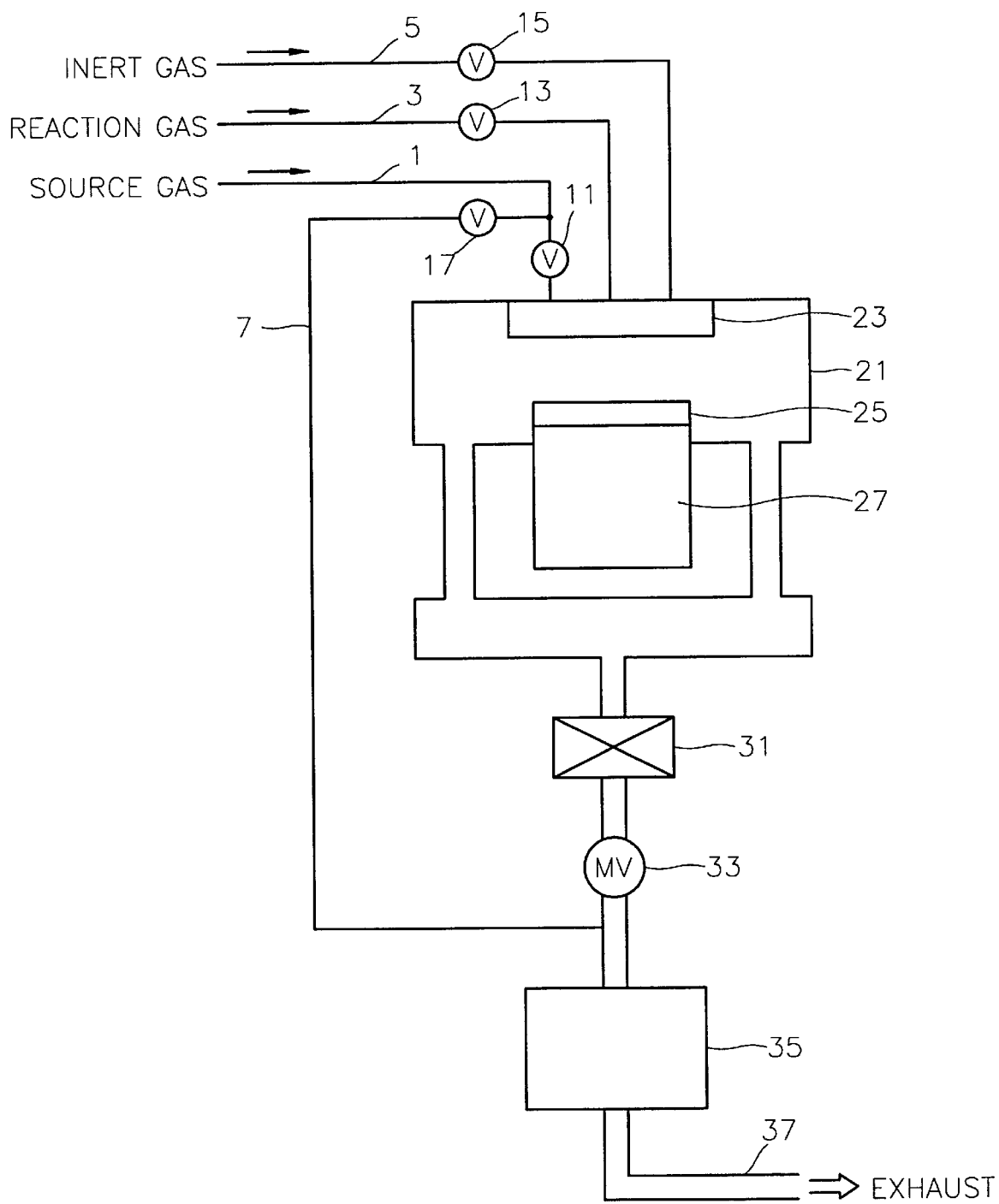
FIG. 1 is a schematic view of a chemical vapor deposition (CVD) apparatus, employing a lamp heating type apparatus.
Figure 4:
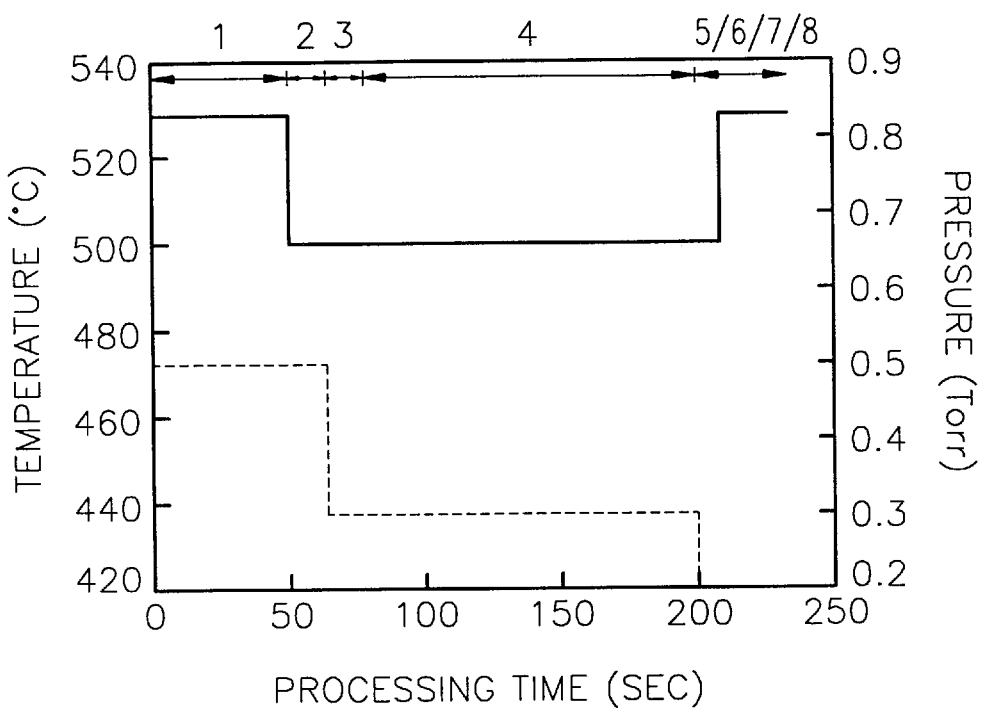
FIG. 4 is a graph showing a simulated situation where the pressure of the chamber and the temperature of the susceptor are varied when a thin film is deposited according to a preferred embodiment.
Figure 5:
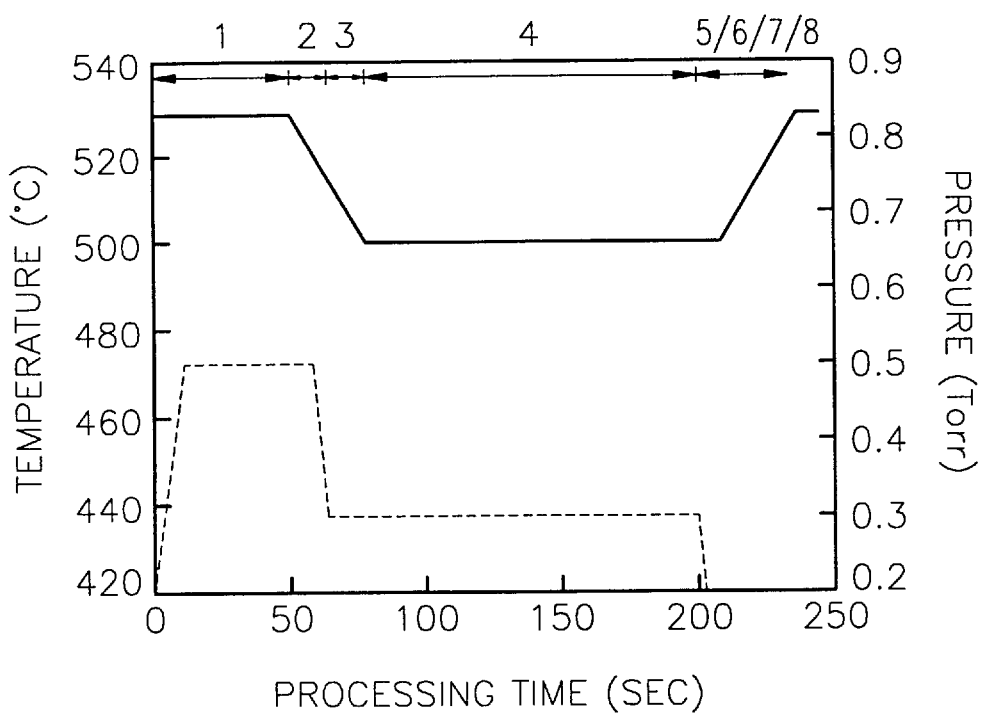
FIG. 5 is a graph showing the actual values of pressure of the chamber and temperature of the susceptor.

The present invention discloses a method of increasing the productivity of the single wafer type apparatus as shown in FIG. 1, using the results of the Experimental Examples 1 and 2. FIGS. 4 and 5 illustrate simulated and actual cases of depositing a thin film using a single wafer type apparatus employing a lamp heating method according to the present invention. Here, the dashed line represents the pressure and the solid line represents the temperature. Also, the numerals at the top of the graphs represent the processing steps as described further below.

First, during steps 1–3 (stabilization), a wafer is mounted onto the susceptor 25 and then the pressure of the chamber 21 is brought to the deposition pressure by injecting an inert gas such as helium (He), argon (Ar) or nitrogen ($N_2$) into the chamber 21 through the inert gas injection tube 5. At the same time, the flow rate of the source gas is stabilized while the source gas bypasses the chamber 21 via the bypass line 7 in order to prevent the source gas from being introduced to the chamber 21. Also, at this time, the temperature of the susceptor 25 is brought to the deposition temperature.

In the conventional deposition method, a wafer that is maintained at room temperature is mounted onto the susceptor at a predetermined temperature and then the temperature is increased. However, in the present invention, after increasing the temperature of the susceptor 25 to a level that is higher than the deposition temperature, the temperature of the susceptor 25 is maintained at that higher temperature for the first step and then decreases to the deposition temperature during the second step.

Also, the pressure of the chamber 21 is increased to a level that is higher than the deposition pressure, which higher pressure is maintained for the first and second steps, and then decreases to the deposition pressure during the third step.

As a result, the time for stabilizing the temperature of the wafer can be shortened. Here, since the time required for decreasing the pressure is shorter than that for decreasing the temperature, it is preferable that the temperature of the susceptor 25 is decreased in the second step and then the pressure is decreased in the third step.

Of course, the total stabilization time (i.e., the duration of steps 1–3) in the present invention must be shorter than the conventional case (i.e., where the temperature and pressure are increased and maintained at the same levels as the deposition conditions), thereby resulting in a higher yield per unit hour. The total stabilization time is the sum of the time required for increasing the temperature of the susceptor 25 and the pressure of the chamber 21 to levels that are higher than the deposition conditions, and maintaining those levels for a period of time before decreasing the temperature and pressure prior to the deposition step.

According to the embodiment of the present invention, when the deposition temperature and the deposition pressure are set to 500° C. and 0.3 Torr, respectively, the temperature of the susceptor 25 and the pressure of the chamber 21 are increased to 530° C. and 0.5 Torr, respectively, before the deposition step.

In step four the source gas and the reaction gas are introduced to the chamber 21 via the source gas injection tube 1 and the reaction gas injection tube 3, respectively, where they react, such that a thin film is deposited on the surface of the wafer at approximately 500° C.

Steps 5 through 8 generally include releasing the vacuum condition on the chamber and purging any remaining source gas in the chamber 21 and the source gas injection tube 1. More specifically, in step 5 the vacuum condition on the chamber is released. In step 6 inert gas is first provided to the chamber 21 through the source gas injection tube 1 and valve 11 to begin purging a portion of the source gas injection tube 1 and the chamber 21. After several seconds, the inert gas is provided (step 7) to the bypass line 7 through valve 17 to purge the source gas therein. The reason for a two-step purge process is to prevent a back stream flow of source gas through the chamber 21 as follows. If the purging inert gas were provided to the bypass line 7 first, and since the main valve 33 would be open during the purging process for the chamber 21, the inert gas could flow from the bypass line 7 back through the main valve 33 and into the chamber 21. Thus, by flowing the inert gas through the chamber 21 first, any potential back flow from the bypass line 7 is prevented.

In step 8, the purging inert gas from the bypass line 7 and the chamber 21 is exhausted through the exhaust tube 37 using the pump 35.

Also, preferably, the portion of the source gas injection tube 1 upstream of the valve 17 is purged via the bypass 7 rather than allowing any remaining source gas to flow through the chamber 21, due to the following reason. If, as shown in FIGS. 4 and 5, the purging steps are performed at a higher temperature than the deposition step in order to shorten the time for stabilizing the wafer temperature, the source gases remaining in the source gas injection tube 1 would be introduced into the chamber 21 together with the inert gas used for purging. As a result, a thin film is deposited at a higher rate than the deposition rate, resulting in a film different from the intended film.

After the final purge step (step 8), the temperature of the susceptor 25 and the pressure of the chamber 21 are increased to levels higher than the deposition temperature and pressure, respectively, to prepare for the next wafer. Since it takes longer to increase the temperature than to increase the pressure, the temperature of the susceptor 25 is increased first to a level higher than the deposition temperature during one of the steps 5 through 8, preferably, the seventh step. As a result, the time required for increasing the temperature of the following wafer to the level required for step one can be further reduced.

Figure 6:
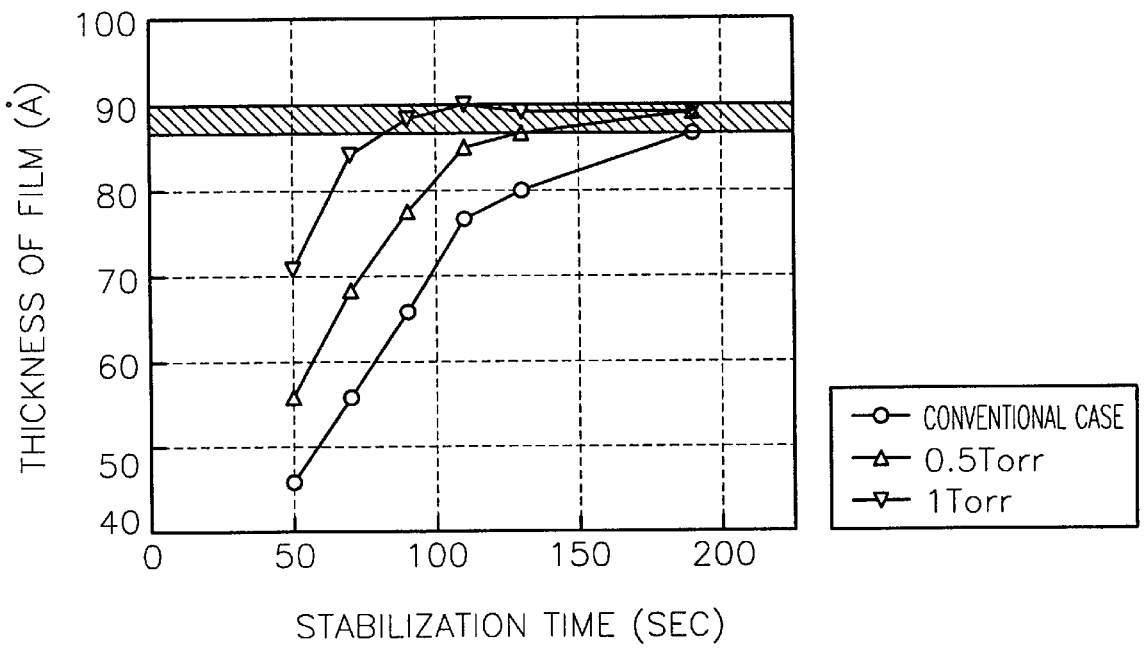
FIG. 6 is a graph showing the change in thickness of the thin film according to the stabilization time when the deposition pressure is increased to various levels.

FIG. 6 shows the change in thickness of the thin film according to the stabilization time in three exemplary cases: first, in the conventional case, the deposition temperature and the deposition pressure are maintained at 500° C. and 0.3 Torr, respectively; second, the pressure is increased to 0.5 Torr in the first step; and third, the pressure is increased to 1 Torr in the first step. The duration of the fourth step (deposition step) is set to 190 seconds in all three exemplary cases. Note that the initial stabilization time, prior to the deposition step, is considered to be sufficient when the thickness of the thin film reaches the level of the hatched portion of FIG. 6.

As the pressure is increased from 0.3 Torr to 0.5 Torr and 1 Torr, the stabilization time is approximately 190 seconds, 130 seconds, and 80 seconds, respectively. Thus the time required for stabilizing the temperature of the wafer, that is, the total time of the first through third steps, decreases as the pressure of the chamber is increased to 1 Torr. Accordingly, the time required for processing one wafer can be reduced significantly, thereby increasing the wafer processing capacity per hour.

Figure 7:
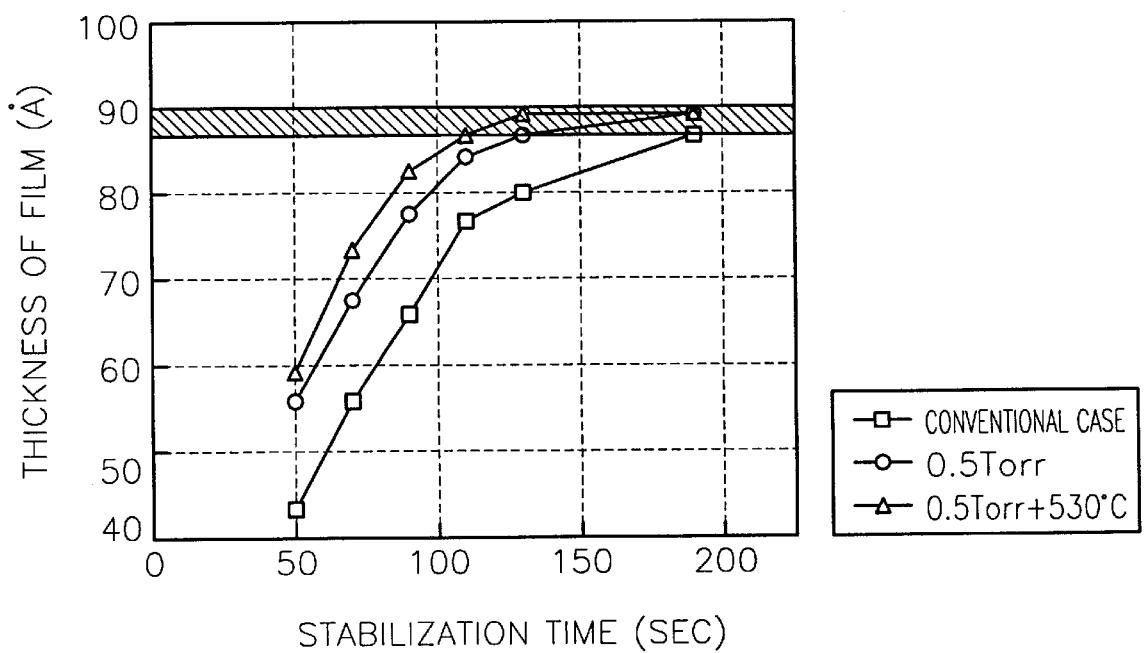
FIG. 7 is a graph showing the change in thickness of the thin film according to the stabilization time when the deposition pressure and temperature are increased to various levels.

FIG. 7 shows the change in thickness of the thin film according to the stabilization time in three exemplary cases: first, in the conventional case as above, the deposition temperature and the deposition pressure are maintained at 500° C. and 0.3 Torr, respectively; second, the pressure is increased to 0.5 Torr in the first step; and third, the pressure and the temperature are increased to 0.5 Torr and 530° C., respectively, in the first step. Here, the duration of the fourth step (deposition step) is set to 190 seconds in all three exemplary cases.

As noted above, the initial stabilization time, prior to the deposition step, is considered to be sufficient when the thickness of the thin film reaches the level of the hatched portion of FIG. 7.

In the third case where both the pressure and the temperature are increased in the first step, the initial stabilization time can be reduced by approximately 20 seconds compared with the second case where only the pressure is increased. Thus the stabilization time can be reduced by increasing the temperature, even though the effect of the temperature is less than that of the pressure when compared to the examples in FIG. 6.

As described above, in the method of fabricating a semiconductor device using a single wafer type apparatus according to the present invention, the pressure of the chamber and/or the temperature of the susceptor are/is increased to levels that are higher than the deposition pressure and/or the deposition temperature, before a thin film is deposited. As a result, the stabilization time required for increasing the temperature and the pressure to the deposition temperature and the deposition pressure after a wafer is mounted onto a susceptor can be reduced, thereby increasing the rate at which wafers are processed.

Although the present invention has been described in detail above with respect to the preferred embodiments thereto, various changes, substitutions and alterations thereof will become apparent to those of ordinary skill in the art. All such changes, substitutions and alterations are thus seen to be within the true spirit and scope of the invention as defined by the appended claims.

What is claimed is:

1. A method of depositing a film for a semiconductor device using a single wafer type apparatus employing a lamp heating method, comprising the step of maintaining the pressure of a processing chamber of the apparatus at a level higher than a deposition pressure, before depositing the film.

2. The method of claim 1, wherein the single wafer type apparatus is a chemical vapor deposition (CVD) apparatus.

3. The method of claim 1, further comprising the step of decreasing the pressure of the processing chamber to the deposition pressure before depositing the film.

4. The method of claim 1, wherein the pressure of the processing chamber is increased using an inert gas supplied to the chamber from an inert gas supply source.

5. A method of depositing a film for a semiconductor device using a single wafer type apparatus employing a lamp heating method, comprising the steps of:

(a) loading a wafer into a processing chamber of the apparatus;

(b) increasing the pressure of the chamber to a level higher than a deposition pressure;

(c) decreasing the pressure of the chamber to the deposition pressure; and (d) depositing a film on the wafer.

6. The method of claim 5, wherein the steps (b) and (c) are performed using an inert gas that is supplied to the chamber or released from the chamber, respectively.

7. The method of claim 5, after the step (d), further comprising the step of purging, using an inert gas, a source gas injection tube connected to the chamber via a bypass line connected to the source gas injection tube.

8. A method of depositing a film for a semiconductor device using a single wafer type apparatus employing a lamp heating method, comprising the step of maintaining the temperature of a susceptor installed in a processing chamber of the single wafer type apparatus at a level higher than a deposition temperature, before depositing the film.

9. The method of claim 8, further comprising the step of decreasing the temperature of the susceptor to the deposition temperature, before depositing the film.

10. The method of claim 8, after depositing the film, further comprising the steps of releasing a vacuum condition on the chamber, and purging any gases remaining in the chamber and a source gas injection tube connected to the chamber.

11. The method of claim 10, after the purging step, further comprising the step of increasing the temperature of the susceptor to a level higher than the deposition temperature.

12. A method of depositing a film for a semiconductor device using a single wafer type apparatus employing a lamp heating method, comprising the steps of:

(a) loading a wafer into a processing chamber of the apparatus;

(b) increasing the pressure of the chamber and the temperature of a susceptor installed in the chamber to a level higher than a deposition pressure and a deposition temperature, respectively;

(c) decreasing the pressure of the chamber and the temperature of the susceptor to the deposition pressure and the deposition temperature, respectively; and (d) depositing a film on the wafer.

13. The method of claim 12, wherein in the steps (b) and (c) the pressure of the chamber is increased and decreased using an inert gas supplied to the chamber or released from the chamber, respectively.

14. The method of claim 12, wherein during the step (c), the pressure of the chamber is decreased after a predetermined time period has lapsed after decreasing the temperature of the susceptor.

15. The method of claim 12, after the step (d), further comprising the steps of releasing a vacuum condition on the chamber, and purging any gases remaining in the chamber and a source gas injection tube connected to the chamber.

16. The method of claim 15, after the purging step, further comprising the step of increasing the temperature of the susceptor to a level higher than the deposition temperature.

17. The method of claim 15, wherein the purging step for the source gas injection tube is performed using an inert gas that is flowed through a bypass line connected to the source gas injection tube.

* * * * *